United States Patent [19]

Arimoto

[11] Patent Number: 5,045,899
[45] Date of Patent: Sep. 3, 1991

[54] DYNAMIC RANDOM ACCESS MEMORY HAVING STACKED CAPACITOR STRUCTURE

[75] Inventor: Kazutami Arimoto, Hyogo, Japan

[73] Assignee: Mitsubishi Denki Kabushiki Kaisha, Tokyo, Japan

[21] Appl. No.: 524,769

[22] Filed: May 17, 1990

[30] Foreign Application Priority Data

Dec. 1, 1989 [JP] Japan .................................. 1-313744

[51] Int. Cl.$^5$ ...................... H01L 29/68; H01L 27/10; H01L 27/02; H01L 29/06
[52] U.S. Cl. ..................... 357/23.6; 357/45; 357/51; 357/55
[58] Field of Search ...................... 357/23.6, 51, 55, 45

[56] References Cited

U.S. PATENT DOCUMENTS

| | | | |
|---|---|---|---|
| 4,754,313 | 6/1988 | Takemae et al. | 357/23.6 |
| 4,894,696 | 1/1990 | Takeda et al. | 357/23.6 |
| 4,953,126 | 8/1990 | Ema | 357/23.6 |
| 4,970,564 | 11/1990 | Kimura | 357/23.6 |

FOREIGN PATENT DOCUMENTS

| | | | |
|---|---|---|---|
| 0154685 | 9/1985 | European Pat. Off. | 357/23.6 |
| 3222461A1 | 12/1982 | Fed. Rep. of Germany | 357/23.6 |
| 3918924A1 | 3/1989 | Fed. Rep. of Germany | 357/23.6 |
| 61-251064 | 11/1986 | Japan | 357/23.6 |
| 61-258467 | 11/1986 | Japan | 357/23.6 |
| 63-278363 | 11/1988 | Japan | 357/23.6 |
| 1-257365 | 10/1989 | Japan | 357/23.6 |

OTHER PUBLICATIONS

IEDM publication by Kamura et al., "A New Stacked Capacitor DRAM Cell Characterized by a Storage Capacitor on a Bit-Line Structure", Dec. 1988, pp. 596 to 599.
IEEE Journal of Solid-State Circuits publication by Konishi et al., entitled "Analysis of Coupling Noise Between Adjacent Bit Lines in Megabit DRAMs", vol. 24, No. 1, Feb. 1989, pp. 35 through 42.
Wakamiya et al., "Novel Stacked Capacitor Cell for 64MB DRAM," 1989 Symposium on VLSI Technology Digest of Technical Papers, May 22–25, 1989, pp. 69–70.
Ema et al., "3-Dimensional Stacked Capacitor Cell for 16M and 64M DRAMS", 1988 IEDM, pp. 592–594.
T. Yoshihara et al., "A Twisted Bit Line Technique for Multi-Mb DRAMs", 1988 IEEE International Solid State Circuits Conference, Feb., 1988, pp. 238–239.

*Primary Examiner*—Jerome Jackson, Jr.
*Assistant Examiner*—Daniel Kim
*Attorney, Agent, or Firm*—Lowe, Price, LeBlanc and Becker

[57] ABSTRACT

A DRAM has a memory cell array in which a plurality of word lines (WL) and a plurality of bit lines (B0) are arranged to orthogonally intersect each other. Memory cells (MC) are arranged in a direction intersecting the bit lines. Capacitors (10) of the memory cells are arranged between the adjacent bit lines. On a silicon substrate (20), the bit line is formed substantially at the same height with the word line and positioned lower than the top of the capacitor. An opening region (15) is formed so that electrode layers (11, 13) of the capacitor do not cover the bit line. The arrangement of the capacitors between the adjacent bit lines allows reduction in the inter-bit-line capacitance. In addition, formation of the region above the bit line which is not covered by the electrode layers of the capacitor makes it possible to reduce the stray capacitance between the capacitor and the bit line. As a result, reduction in amount of the read-out signals which might be caused by an increased bit-line capacitance can be prevented.

25 Claims, 9 Drawing Sheets

DYNAMIC RANDOM ACCESS MEMORY HAVING STACKED CAPACITOR STRUCTURE

BACKGROUND OF THE INVENTION

1. Field of the Invention

The present invention generally relates to semiconductor memory devices, and more particularly, to an improvement in DRAM cell array structure reducing inter-bit-line noise.

2. Description of the Background

Among other semiconductor memory devices, there is a DRAM (Dynamic Random Access Memory) to and from which random input and output of storage information is possible.

The DRAM generally comprises a memory cell array as a memory area for storing a great deal of storage information and peripheral circuits required for input from and output to outside.

FIG. 8 is a block diagram showing a general DRAM structure. Referring to this diagram, a DRAM 50 comprises a memory cell array 51 for storing data signals of storage information, a row and column address buffer 52 for receiving address signals ($A_0$ to $A_9$) from outside, based on which one of a plurality of memory cells each constituting a unit memory circuit is selected, a row decoder 53 and a column decoder 54 for specifying the memory cell by decoding the address signals, a sense refresh amplifier 55 for amplifying and reading out a signal stored in the specified memory cell, a data-in buffer 56 and a data-out buffer 57 for data input and output, and a clock generator 58 for generating a clock signal.

FIG. 9 is an equivalent circuit diagram showing structure of one bit-line pair of the so-called folded-bit-line system for explaining storing operation of a memory cell array. Paired bit lines B0 and $\overline{B0}$ are connected to a single sense amplifier SA. Word lines WL1 to WL4 extend parallel to each other. The bit lines B0 and $\overline{B0}$ and the word lines WL1 to WL4 are formed to orthogonally intersect each other. Furthermore, at each intersection between the bit lines B0 and $\overline{B0}$ and the word lines WL1 to WL4, there is formed a memory cell MC.

The memory cell MC comprises one transfer gate transistor TR and on capacitor C. The DRAM determines presence of charge stored in this capacitor C to identify storage information.

Basic operation of the DRAM will be described hereinafter with reference to FIG. 9. Initially, in data writing operation, a positive voltage is applied, for example, to the word line WL1 to turn the transfer gate transistor TR on. In this state, when "L" is to be written in the memory cell MC, voltage $V_{BL}$ of the bit line B0 is set to 0 V to supply electrons from the bit line B0 to the capacitor C. On the other hand, when "H" is to be written in, the bit line potential $V_{BL}$ is set to $V_{cc}$ (supply voltage) to extract electrons from the capacitor C.

Subsequently, data reading operation will be described. First, one pair of the bit lines B0 and $\overline{B0}$ is precharged to a potential of $V_{cc}/2$ and put in the floating state (not shown in FIG. 9). Then, a specific word line WL1 is selected, to which a predetermined potential is applied to turn the transfer gate transistor TR on. This causes the charge stored in the capacitor C to be read out on the bit line B0 so that the potential $V_{BL}$ of the bit line B0 fluctuates a little to $V_{BL}+\Delta V_{BL}$. The fluctuation potential $\Delta V_{BL}$ of the bit line B0 is given by $$\Delta V_{BL} = \pm \frac{V_{cc}}{(1 + C_B/C_S)} \; ; \; \begin{array}{l} +: \text{``H''} \\ -: \text{``L''} \end{array} \tag{1}$$

where $C_B$ represents charge capacitance of the bit line and $C_S$ represents capacitance of the capacitor. The small potential difference $\Delta V_{BL}$ between these bit lines B0 and $\overline{B0}$ is then detected by the highly sensitive sense amplifier SA to determine presence of data. In this manner, the signal potential (fluctuation potential) $\Delta V_{BL}$ is determined depending on ratio between $C_B$ and $C_S$. Therefore, value of the ratio must be made small.

FIG. 10 is an equivalent circuit diagram of a memory cell array comprising three pairs of bit lines. Referring to the diagram, charge capacitance $C_B$ of a bit line is represented by the expression, $C_B = C_0 + 2C_{BB}$, where $C_0$ is stray capacitance and $C_{BB}$ is inter-bit-line capacitance formed between bit lines adjoining each other with an insulating layer interposed therebetween. In the recent pursuit of a large capacity memory, memory cell area has been scaled down and thus spacing between the adjoining bit lines has also become smaller. Therefore, the inter-bit-line capacitance $C_{BB}$ has become large, increasing noise between the bit lines. This leads to a substantially decreased amount of the signals read out of the memory cells due to influences of the noise, as has been reported in "ISSCC Tech. Dig. Paper, T. Yoshihara et al pp. 238-239". In the following, such a state will be described with reference to FIG. 10.

Assume now that data of "H" have been written in the three memory cells MC0, MC1 and MC2 shown in the diagram. In reading operation, all of the bit lines B0 to B2 are precharged to the same potential and then a predetermined potential is applied to the word line WL1, so that the data of the memory cells MC0 to MC2 are read out. At this time, the bit lines B0 to $\overline{B2}$ that provide reference potentials receive noise in the direction of potential rise through inter-bit-line capacitances $C_{BB0}$ to $C_{BB2}$ from their adjacent bit lines B0 to B2, respectively, all of which have had "H" read out thereon. Conversely, the bit lines $\overline{B0}$ to $\overline{B2}$ with "H" read out thereon receive noise in the direction of potential fall from the bit lines B0 to $\overline{B2}$, respectively, that provide the reference potentials. Therefore, reading potential difference (signal potential) $\Delta V_{BL}$ between the paired bit lines (B0 and $\overline{B0}$ . . . ) becomes small. Thus, the signal potential may possibly not be detected in a sense amplifier SA0.

In other words, as shown in the expression (1) above, if the inter-bit capacitance $C_{BB}$ is increased, then the charge capacitance $C_B$ of bit line is increased so that $C_B/C_S$ becomes large, decreasing $\Delta V_{BL}$.

For suppressing the decrease of this signal potential $\Delta V_{BL}$, two methods have been proposed:

One method is to increase the capacitance $C_S$ of capacitor. An example of this method is shown in FIGS. 11 and 12. FIG. 11 is a partial plan view of a memory cell array and FIG. 12 is a cross sectional view along the line XII to XII in FIG. 11. This example has been disclosed in "NOVEL STACKED CAPACITOR CELL FOR 64Mb DRAM" ('89 May 22. Symposium on VLSI Technology Digest of Technical Papers, pp. 69-70, W. Wakamiya et al). A U.S. patent application concerning DRAMs corresponding to the document was filed 7th July, 1989 by the present applicant. The memory cell array of the DRAM comprises a plurality of word lines WL1 to WL6 extending parallel on a main surface of a p-type silicon substrate 20, and a plurality of bit lines B0 and $\overline{B0}$ extending orthogonally thereto. In the vicinity of each intersection between the word lines WL1 to WL6 and the bit lines B0 and $\overline{B0}$, there is formed a memory cell MC. The memory cell MC comprises one transfer gate transistor 1 and one capacitor 10. The transfer gate transistor 1 comprises one pair of n-type impurity regions 3 and 3, and a gate electrode (word line) WL1 to WL6 formed on the substrate with a gate insulating film 2 interposed therebetween. The gate electrode (word line) WL1 to WL6 is covered by an insulating film 4.

The capacitor 10 has a stacked structure of a lower electrode (storage node) 11, a dielectric layer 12 and an upper electrode (cell plate) 13. The lower electrode 11 has a part connected to one of the paired n-type impurity regions 3 of the transfer gate transistor 1. Further, this lower electrode 11 comprises two parts in terms of structure. One is a flat portion 11a extending from above one word line WL3 to above another word line WL4. An insulating film 4 is disposed between the word lines WL3 and WL4 and the flat portion 11a of the lower electrode 11. The other part of the lower electrode 11 is a cylindrical portion 11b protruding upward from a surface of the flat portion 11a. By providing this cylindrical portion 11b of the lower electrode, facing area between the lower electrode 11 and the upper electrode 13 facing each other with the dielectric layer 12 interposed therebetween is increased, enlarging capacitance of the capacitor. Meanwhile, on the insulating film covering the word line WL1 to WL6, there is formed a nitride film 14 which has been used as an etching protection film.

The memory cells MC are insulated and isolated from each other due to the field shield isolation structure. The field shield isolation structure has a field shield gate electrode 22 which has been formed on a surface of the p-type silicon substrate 20 with a field shield gate insulating film 21 interposed therebetween. Furthermore, above the field shield gate electrode 22, there are arranged the word lines WL4 and WL5 with an insulating layer 23 interposed therebetween. Ground potential or a negative potential is applied to the field shield gate electrode 22. Therefore, a pseudo-MOS transistor structure comprising the field shield gate electrode 22 as a gate electrode of a transistor is always held in the off-state. As a result, device isolation can be attained.

The memory cells are covered by an interlayer insulating layer 24. In the interlayer insulating layer 24 there is formed a contact hole 25 to reach one of the paired n-type impurity regions 3 of the transfer gate transistor 1. The bit line $\overline{B0}$ is formed over the interlayer insulating layer 24 and electrically connected to the transfer gate transistor 1 through the contact hole 25.

The other methods for suppressing the decrease of the signal potential $\Delta V_{BL}$ is to exclude influences of the inter-bit-line noise. An example of this method is shown in FIGS. 13 and 14. This example has been described, for example, in "A new stacked Capacitor DRAM cell characterized by a storage Capacitor on a Bit-line Structure" by S. Kimura et al pp. 596 to 599 of IEDM 88. FIG. 13 is a partial plan view of a memory cell array of the DRAM shown in this example and FIG. 14 is a sectional view along the line XIV to XIV in FIG. 13. FIG. 15 is a sectional view along the line XV to XV in FIG. 13. Referring to the diagrams, the memory cell array of the DRAM comprises a plurality of word lines WL1 to WL7 extending parallel to each other on a main surface of a p-type silicon substrate 20, and a plurality of bit lines B0, $\overline{B0}$, and B1 extending in a direction orthogonally intersecting therewith. An active area 27 is formed to extend in a diagonal direction with respect to the bit lines B0 to B1. The bit lines B0 to B1 extend riding over tops of the word lines WL1 to WL6 with an insulating layer 4 interposed therebetween as far as they intersect the word lines WL1 to WL6, while between the word lines being connected to one of the paired n-type impurity regions of the transfer gate transistor 1. Adjacent capacitors 10 and 10 partially extend over any of the bit lines B0 to B1 with an insulating layer 26 interposed therebetween. In other words, this memory cell array has the bit lines B0 to B1 placed in a lower position about at the surface level of the p-type silicon substrate 20, and the capacitors 10 arranged between the bit lines adjoining each other. Therefore, influences of the inter-bit line noise generated between the bit lines are eliminated due to shield effect of an upper electrode 13 and a lower electrode 11 of the capacitor 10.

The above-mentioned methods have also, however, their own limitations. In the former case, the miniaturized structure brings about a proportional increase of the inter-bit-line capacitance while decreasing the capacitance of capacitor substantially in proportion to square of reduction in size of the device structure. Therefore, it is difficult to increase the capacitance of capacitor so as to make ratio between the bit line capacitance $C_B$ and the capacitor capacitance $C_S$ constant.

In the latter example, it is possible to reduce proportion of the inter-bit line capacitance $C_{BB}$ taken in the bit line capacitance $C_B$. As shown in FIG. 14, however, the bit line 6 is covered by the upper electrode 13 of the capacitors 10 with the insulating layer 26 interposed therebetween. Therefore, stray capacitance $C_0$ formed between the bit line 6 and the upper electrode 13 prevents reduction of the bit line capacitance $C_B$ as a whole.

SUMMARY OF THE INVENTION

An object of the present invention is to suppress decrease in amount of the signals read out of memory cells even in a DRAM of a miniaturized device structure.

Another object of the present invention is to reduce bit line capacitance of a DRAM.

Still another object of the present invention is to reduce stray capacitance of a bit line.

A further object of the present invention is to reduce stray capacitance between a capacitor and a bit line in a DRAM.

Still a further object of the present invention is to prevent inter-bit-line noise being generated between adjacent bit lines.

A further object of the present invention is to reduce inter-bit-line capacitance of a DRAM having a cylindrical stacked capacitor.

The present invention discloses a DRAM with a memory area in which a plurality of unit memory cells each comprising one switching device and one capacitor are arranged, which comprises a first conductivity-type semiconductor substrate having a main surface, a plurality of word lines extending parallel on the main surface of the semiconductor substrate, a plurality of bit lines extending in a direction orthogonally intersecting the word lines, and a plurality of memory cells arranged in a direction diagonally intersecting the word lines and the bit lines.

The memory cell comprises a switching device and a capacitor. The switching device comprises one pair of second conductivity-type impurity regions formed in the semiconductor substrate in a direction diagonally intersecting the word lines, and a gate electrode layer formed of a part of the word line. Further, the capacitor is arranged between the adjacent bit lines to have an extending portion positioned higher than the bit lines.

Furthermore, the capacitor comprises a first electrode layer connected to one of the paired second conductive-type impurity regions of the switching device, a dielectric layer covering the surface of the first electrode layer, and a second electrode layer covering the surface of the dielectric layer. Additionally, above the bit line there is formed at least one region covered only by an insulating layer but not by the first nor second electrode layer of the capacitor.

In the DRAM according to the present invention, the capacitor is arranged between the adjacent bit lines. The second electrode layer of the capacitor is set to a fixed potential. This means that between the bit lines, there exists a fixed electrode providing shield effect, so that the inter-bit-line capacitance is decreased.

Furthermore, above the bit line there is provided a region where no electrode layer such as the first or second electrode has been formed. Therefore, formation of stray capacitance between a bit line and an overlying electrode layer as has been seen in the conventional devices will be avoided, resulting in a reduced stray capacitance.

As a result of the aforementioned, bit line capacitance is reduced so that it becomes possible to suppress noise that decreases amount of the signals read out of the memory cells, enlarging reading margin from the memory cells.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the accompanying drawings.

Figure 1:
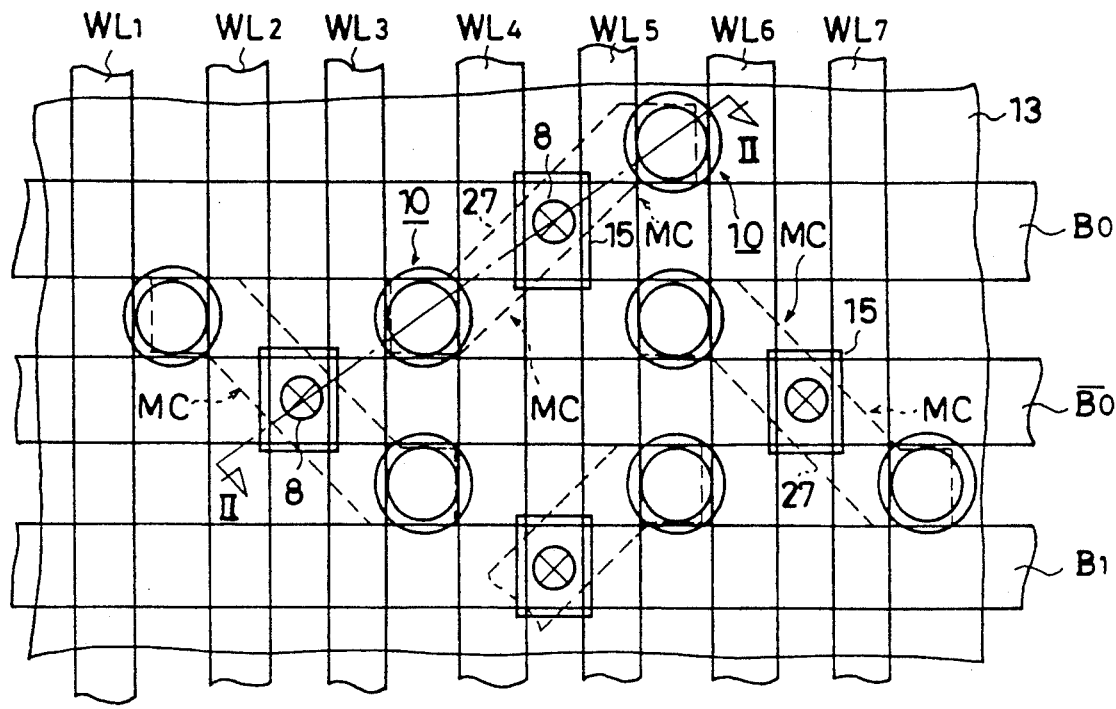
FIG. 1 is a plan view of a memory cell array of a DRAM according to an embodiment of the present invention.
Figure 2:
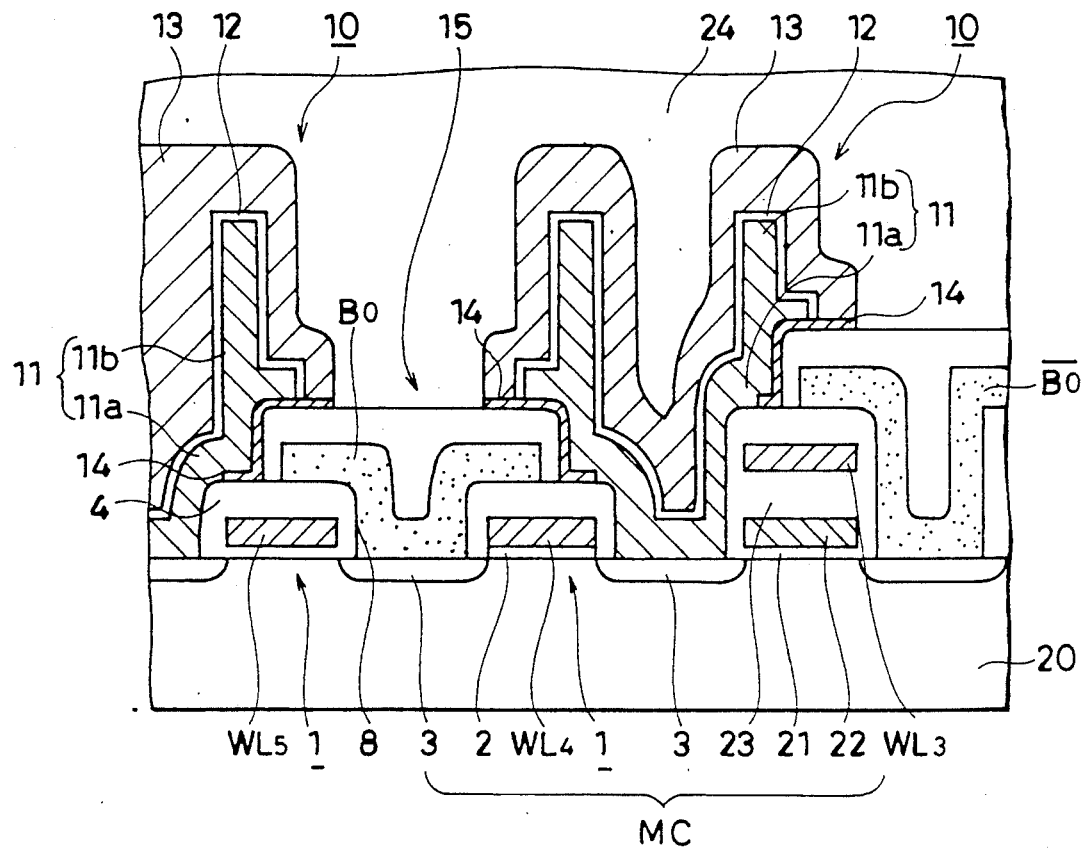
FIG. 2 is a sectional view along the line II to II in FIG. 1.

Referring to FIGS. 1 and 2, on a main surface of a p-type silicon substrate 20 there are formed a plurality of word lines WL1 to WL7 extending parallel to each other, and a plurality of bit lines B0 to B1 extending in a direction orthogonally intersecting therewith. A plurality of memory cells MC are aligned along an axis diagonally intersecting the bit lines B0 to B1. Further, memory cells corresponding to two bits are connected to any of the bit lines B0 to B1 through a single bit line contact portion 8.

The memory cell MC comprises one transfer gate transistor 1 and one capacitor 10. The transfer gate transistor 1 comprises one pair of n-type impurity regions 3 and 3 formed in a surface of the p-type silicon substrate 20, and a gate electrode (word line) WL4 formed on a surface of the p-type silicon substrate 20 with a gate insulating layer 2 interposed therebetween. One pair of the n-type impurity regions 3 and 3 are formed in a diagonal direction with respect to the bit line B0. The bit line contact portion 8 is formed in an area where the bit line B0 runs across one of the n-type impurity regions. The capacitor 10 is of a stacked structure comprising a lower electrode (storage node) 11, a dielectric layer 12 and an upper electrode (cell plate) 13. The lower electrode 11 has a portion connected to one of the n-type impurity regions 3 of the transfer gate transistor 1, and comprises a flat portion 11a which has one end extending over the word line WL4 and the bit line B0 with an insulating layer interposed therebetween and the other extending over the word line WL3 and the bit line $\overline{B0}$ with an insulating layer interposed therebetween, and a cylindrical portion 11b protruding upward from a surface of the flat portion 11a. The dielectric layer 12 and the upper electrode 13 cover the surface of the lower electrode 11. Referring in particular to FIG. 1, the lower electrodes 11 and the dielectric layers 12 of the capacitors 10 are arranged between the plurality of bit lines B0 to B1. Furthermore, the upper electrode 13 is formed to cover the memory cell array area and has an opening 15 in an area over a bit line that includes the bit line contact portion 8. Meanwhile, between the capacitors 10 and the word lines WL1 to WL7 or the bit lines B0 to B1 there is formed a nitride film 14. In the manufacturing process, this nitride film 14 has been used as etching stopper for the insulating films 4 and 26 covering the bit lines and the word lines. Additionally, the memory cells are covered by a thick interlayer insulating layer 24.

In this manner, according to the first embodiment, the bit lines B0 to B1 are formed in lower positions than the capacitor 10. Further, the capacitor 10 is arranged between the adjacent bit lines. That is, the upper electrode 13 of the capacitor 10 has a portion at least as high as the bit lines B0 to B1. This structure allows the upper electrode 13 of the capacitor 10 which is set to a fixed potential to be arranged between the adjacent bit lines. As a result, the upper electrode 13 of the capacitor 10 produces good effects as a shield electrode, reducing the inter-bit-line capacitance $C_{BB}$ between the adjacent bit lines. Furthermore, in peripheral areas of the contact portions 8 of the bit liens B0 to B1 there are formed openings 15 in the upper electrodes 13 of the capacitors 10. Therefore, in these openings there exists no electrode layer over the bit lines B0 to B1. Accordingly, in the memory cell array area, the stray capacitance $C_0$ constituted of the upper electrode 13 of the capacitor 10, the insulating layer 26 and the bit line B0 to B1 can be reduced. Due to the combination of the above-mentioned effects, the bit line capacitance $C_B$ is reduced. Furthermore, the cylindrical capacitor 10 provided to the memory cell can increase the capacitor capacitance $C_S$. With both of these results together, it becomes possible to reduce the value of $C_B/C_S$ and ensure that amount of the signals read out of the memory cells will be above a predetermined value.

Figure 3:
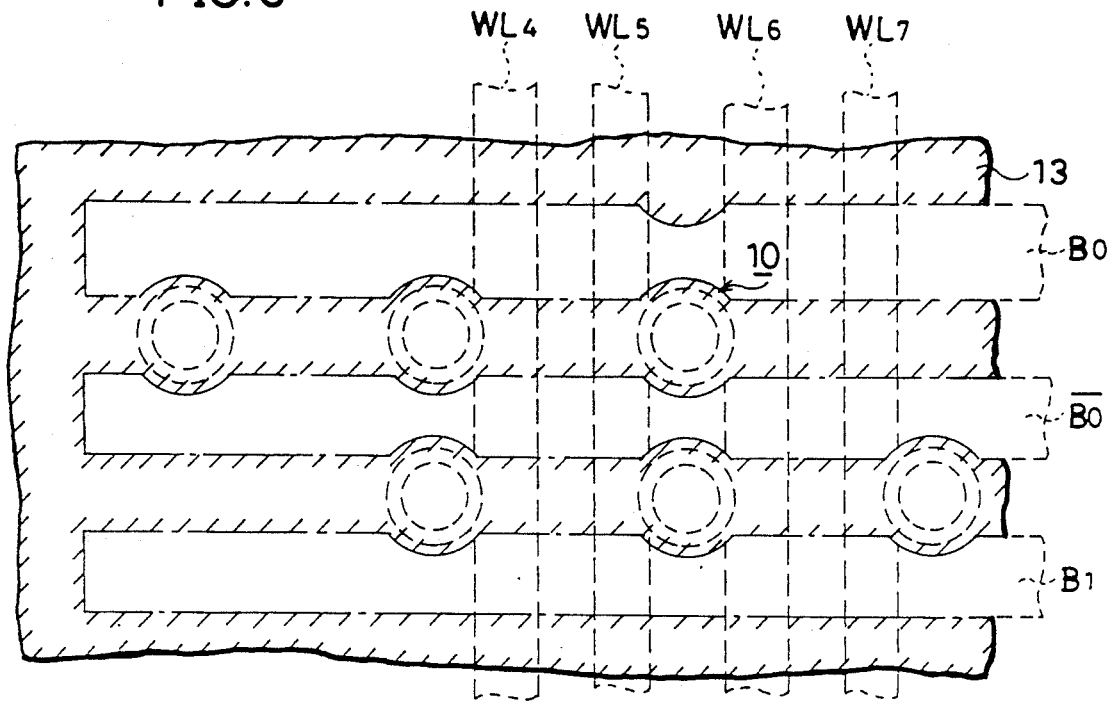
FIG. 3 is a schematical plan view showing the upper electrode of the capacitor of a memory cell array according to a second embodiment of the present invention.

A second embodiment of the present invention will be described with reference to FIG. 3. FIG. 3 is a plan view of a memory cell array corresponding to that of FIG. 1 and in particular shows relationship between the upper electrodes 13 of the capacitors 10 and the bit lines B0 to B1 and the word lines WL4 to WL7 schematically. In the second embodiment, the upper electrodes 13 of the capacitors 10 are of a configuration having the areas over the bit lines B0 to B1 removed. This allows a further reduction in the stray capacitance $C_0$ formed between the capacitors 10 and the bit lines B0 to B1 as compared with that in the first embodiment. Meanwhile, since the upper electrodes 13 of all the capacitors are to be set to the same fixed potential, they are integrally coupled at their ends.

Figure 4:
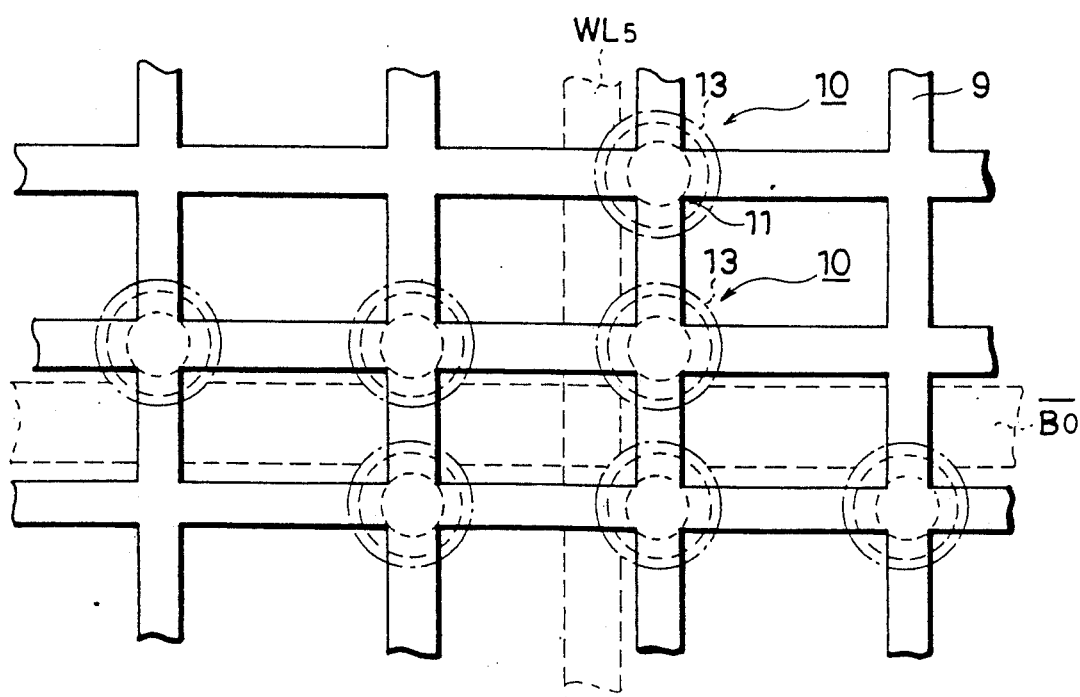
FIG. 4 is a schematical plan view of a memory cell array according to a third embodiment of the present invention.

Subsequently, a third embodiment of the present invention will be described with reference to FIG. 4. In this embodiment, the plurality of capacitors 10 are formed at predetermined positions between the bit lines B0 to B1 separately from each other. Over those capacitors there is formed in a reticulated manner a conductive layer 9 so as to electrically connect the upper electrodes 13 of the respective capacitors 10. The conductive layer 9 is formed of, for example, aluminum.

Figure 5:
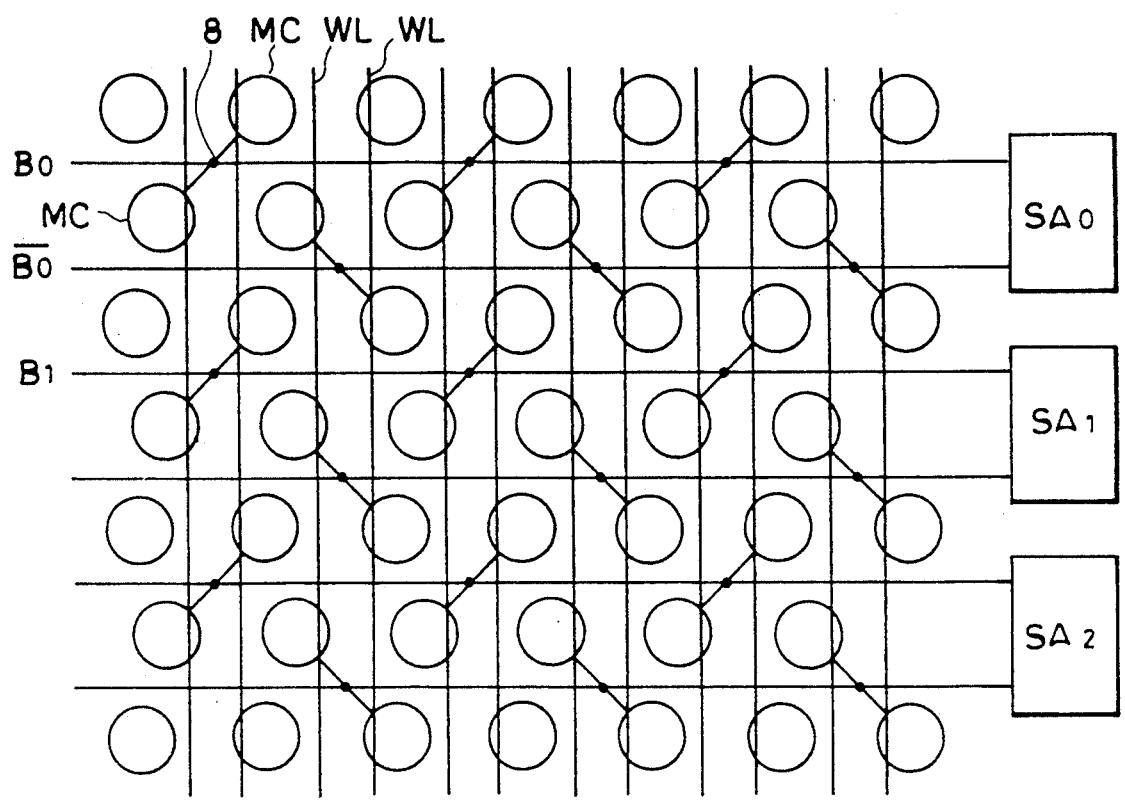
FIG. 5 is an equivalent circuit diagram of a memory cell array of the DRAM according to the present invention.
Figure 10:
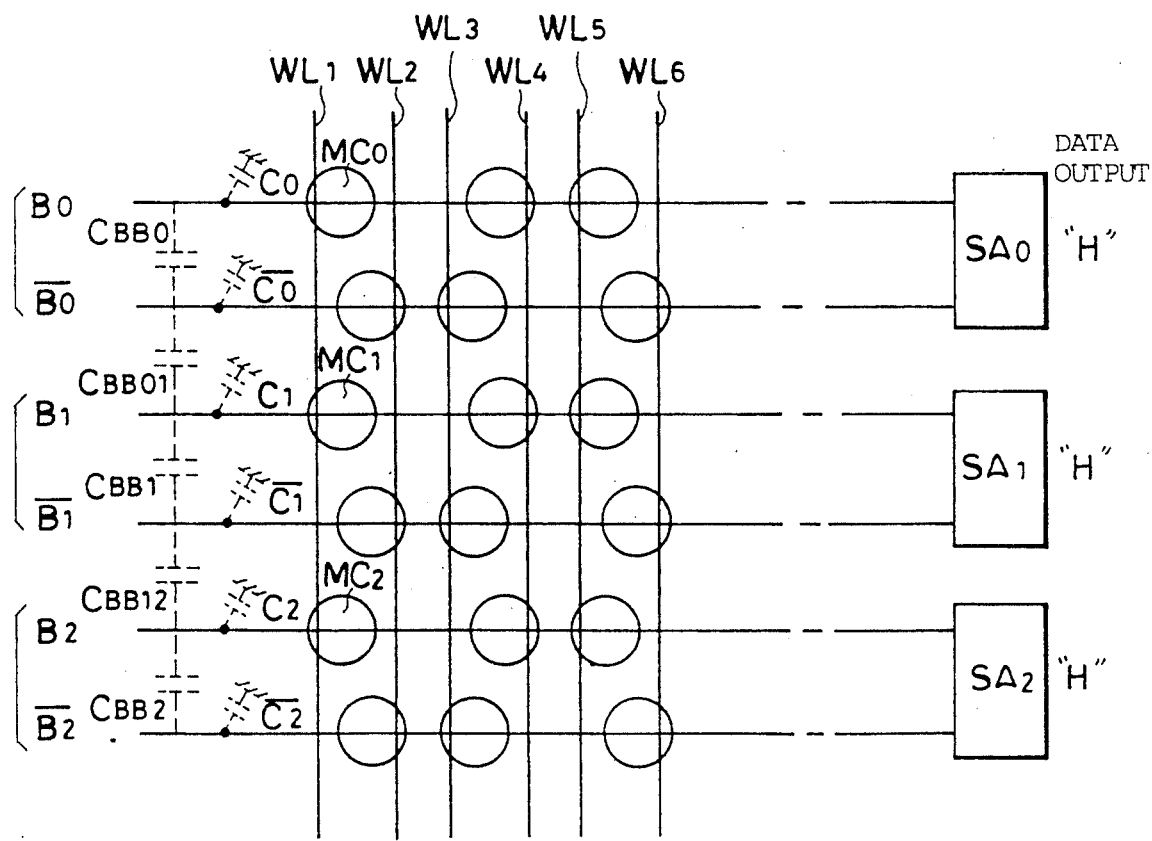
FIG. 10 is an equivalent circuit diagram schematically showing memory cell array structure of the conventional folded-bit-line system.
Figure 11:
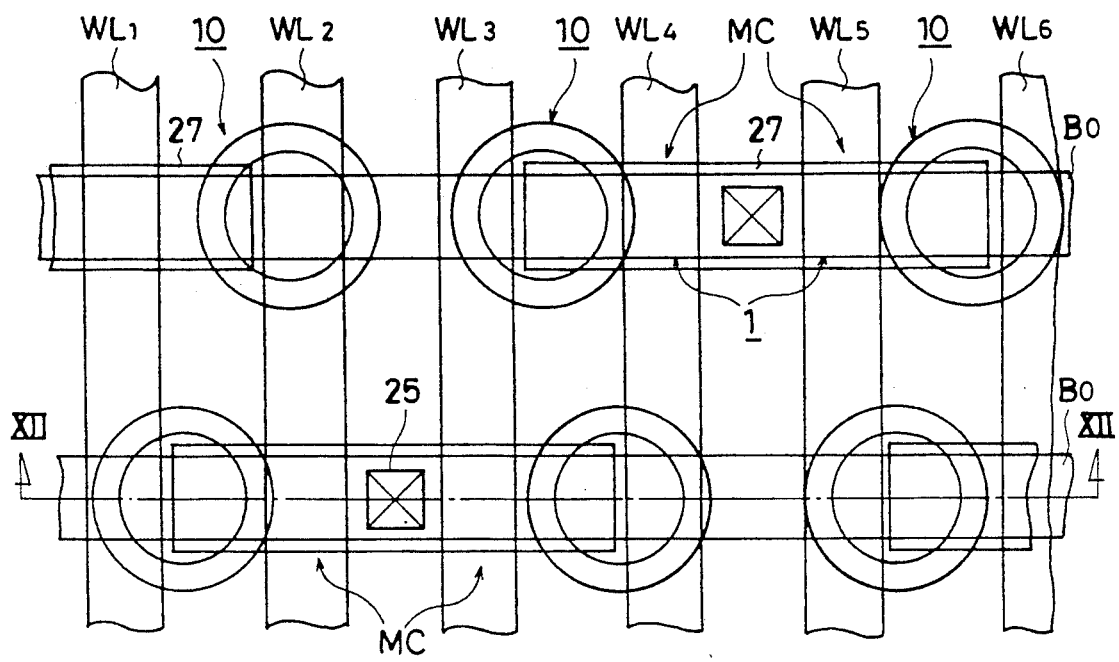
FIG. 11 is a plan view of a memory cell in a conventional DRAM.
Figure 12:
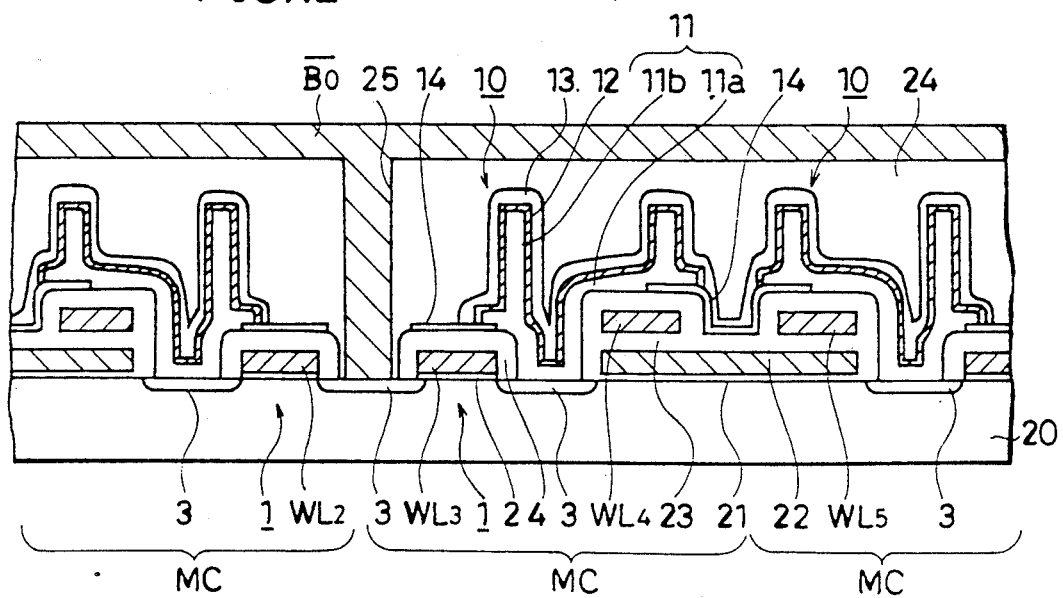
FIG. 12 is a sectional view along the line XII to XII in FIG. 11.
Figure 13:
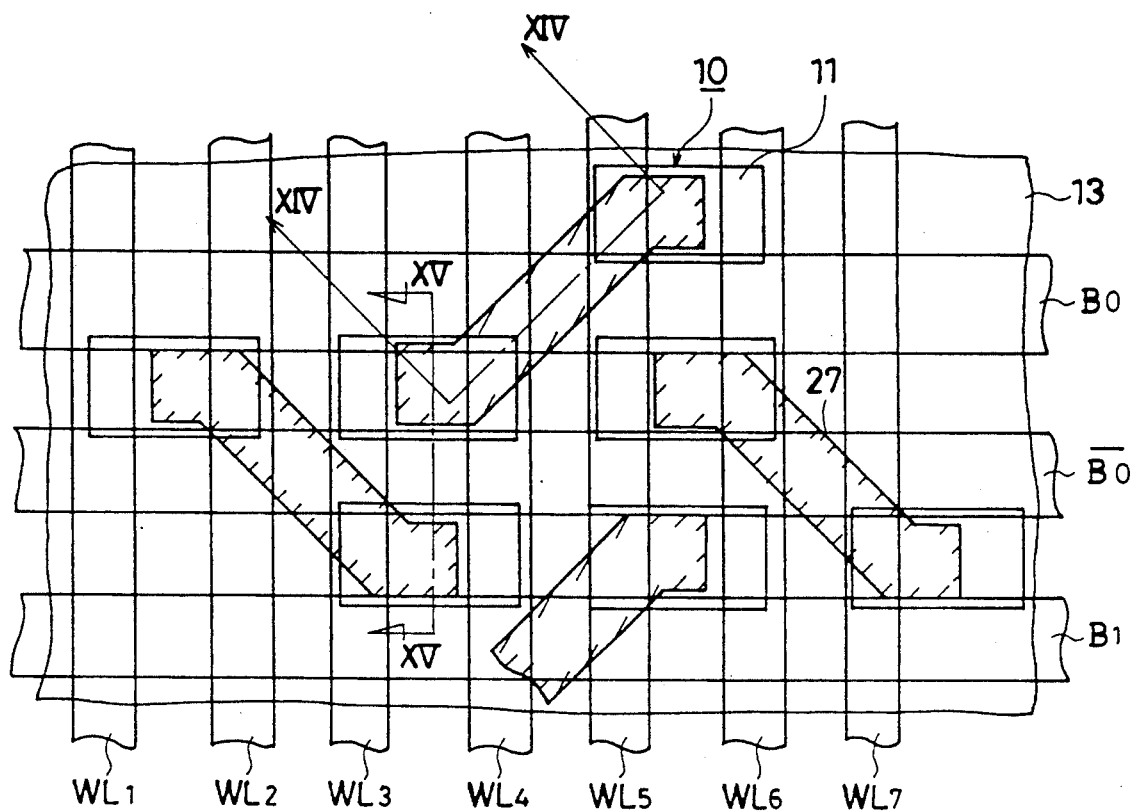
FIG. 13 is a plan view of a memory cell array in another conventional DRAM.
Figure 14:
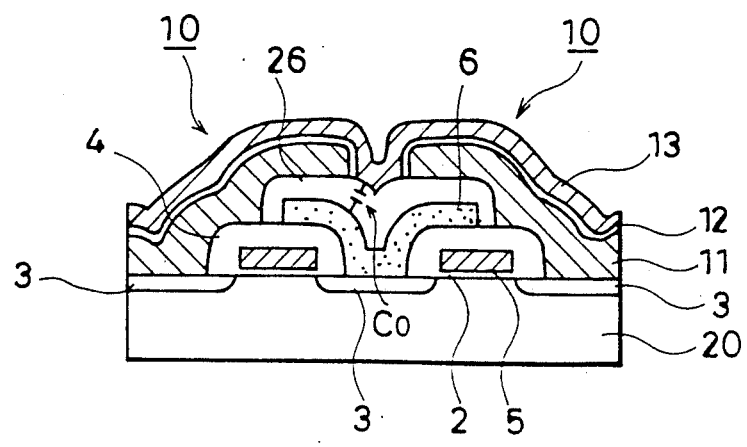
FIG. 14 is a sectional view along the line XIV to XIV in FIG. 13.
Figure 15:
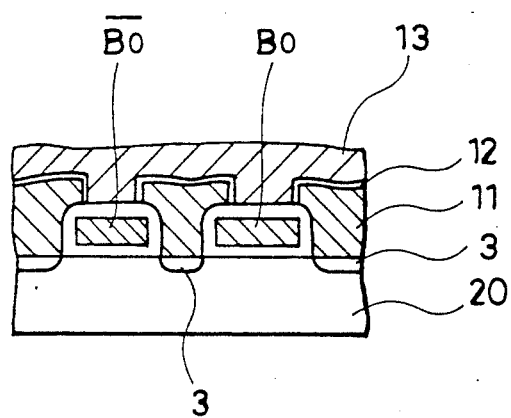
FIG. 15 is a sectional view along the line XV to XV in FIG. 13.

As shown in FIG. 5, the plurality of memory cells are arranged in a memory cell array substantially at the regular intervals. Therefore, the capacitors 10 of the memory cells are also arranged substantially at regular intervals. For example, in the conventional memory cell array of the folded-bit-line system shown in FIG. 10, memory cells are arranged at irregular intervals in the direction in which the bit lines extend. Therefore, with the memory cells adjoining closer to each other, the distance between the capacitors 10 becomes small, bringing about difficulties in processes such as film formation or patterning. As opposed to this, according to the present invention, such a problem as mentioned above can be solved by arranging the memory cells at regular intervals.

Figure 6:
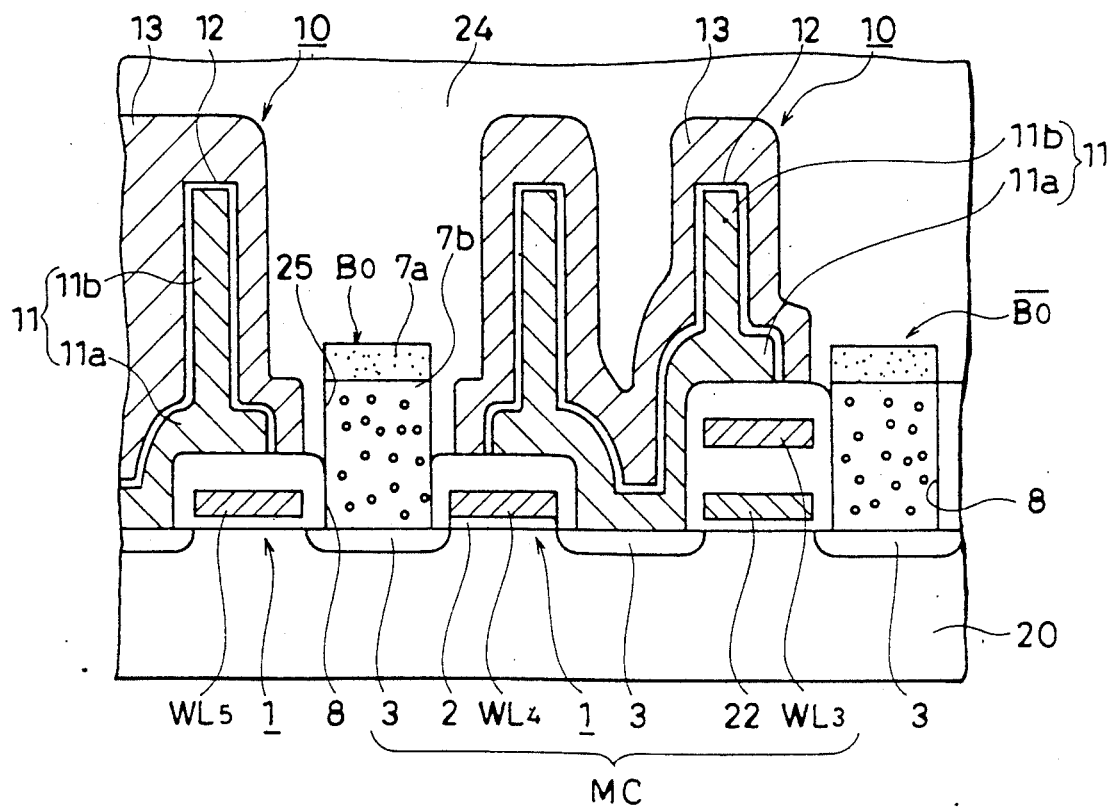
FIG. 6 is a sectional view of a memory cell according to a fourth embodiment of the present invention.

Furthermore, a fourth embodiment of the present invention will be described with reference to FIG. 6. This embodiment is of a modified structure of the bit lines B0 to B1. Therefore, configuration of the upper electrode 13 of the capacitor 10 may be here implemented as any of the above mentioned first, second and third embodiments. The bit lines B0 to B1 comprise an interconnection 7a extending on the main surface of the substrate and a contact portion 7b connected to one of the n-type impurity regions 3 and 3 of the transfer gate transistor 1. The contact portion 7b is formed of tungsten (W) deposited by selective CVD in the interior of a contact hole 25 which has been formed in the interlayer insulating layer 24. On the other hand, the interconnection 7a is formed of a conductive layer such as a polycrystalline silicon layer or a high melting point metal layer. Such a bit line structure allows bit lines to be formed with a smaller width than that in the first to third embodiments above. More specifically, since the formation of the bit lines can be limited to the inside of predetermined contact portions, the patterning process by lithography becomes unnecessary and thus an alignment margin for pattern mask can be omitted. Therefore, there can not be formed any overlap area between the capacitor 10 and the bit line. This means that formation of the stray capacitance $C_0$ between the capacitor 10 and the bit lines B0 to B1 can be almost completely avoided.

Figure 7:
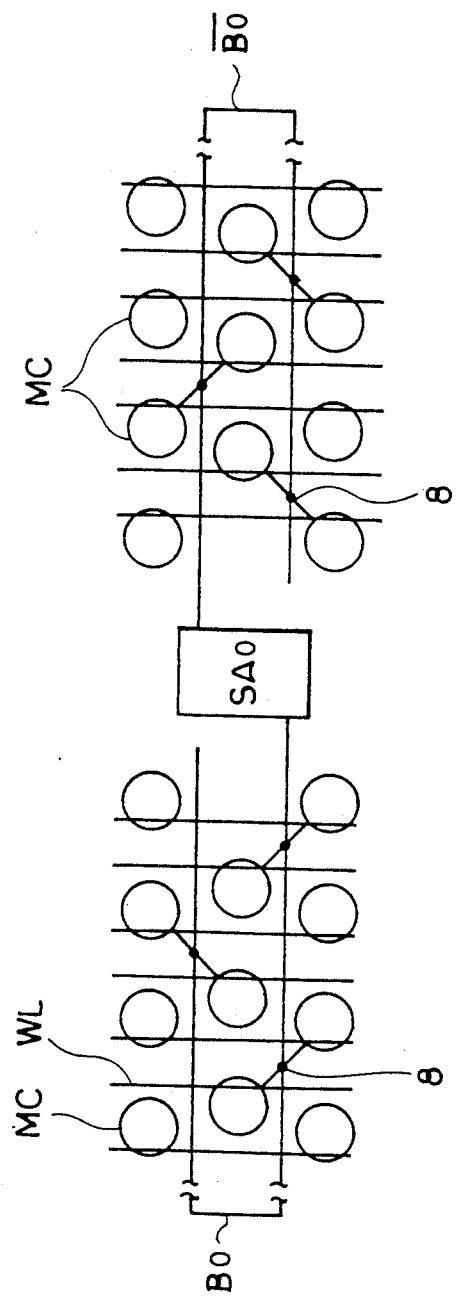
FIG. 7 is an equivalent circuit diagram of the so-called open bit type of memory cell array.
Figure 8:
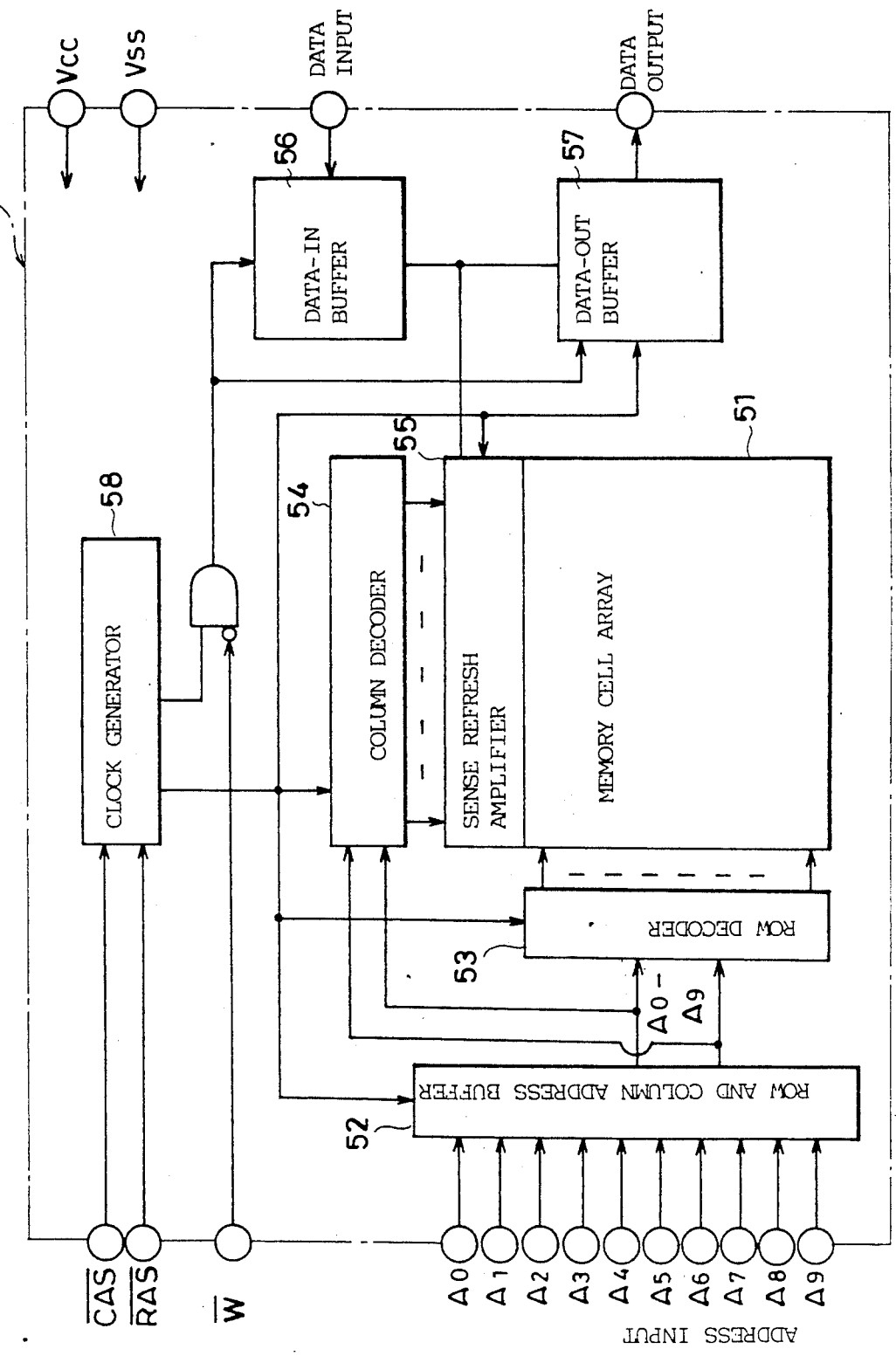
FIG. 8 is a block diagram general structure of a DRAM.
Figure 9:
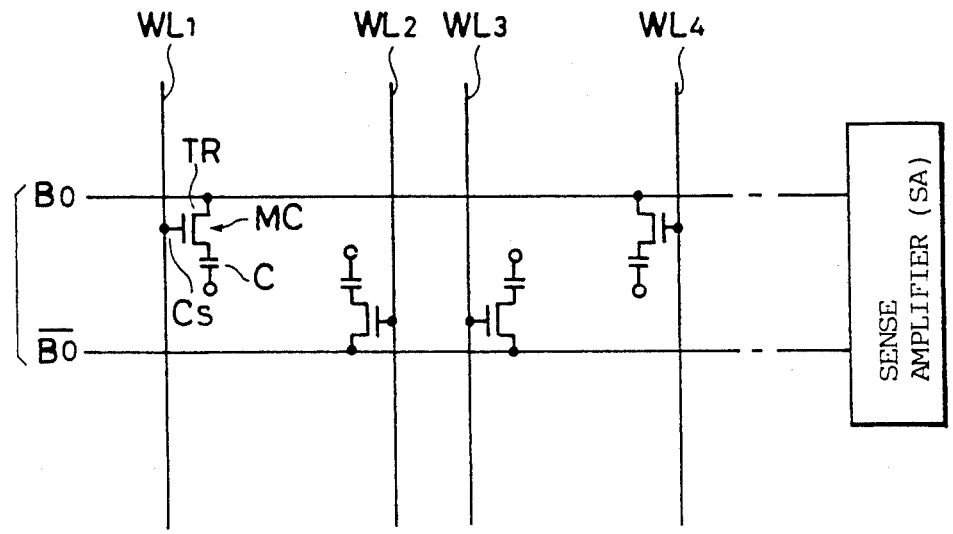
FIG. 9 is an equivalent circuit diagram of the so-called folded-bit-line system of memory cell array.

Furthermore, a fifth embodiment of the present invention will be described with reference to FIG. 7. In the diagram, there is shown a so-called open-bit-line type of memory cell array comprising one pair of bit lines B0 and $\overline{B0}$ which are arranged to extend on the right and left sides of a sense amplifier SA0. One bit line B0 is formed by coupling two parallel bit lines with their ends in a U-shaped manner and has one end connected to the sense amplifier SA0 and the other put in a floating state. Also in this open-bit-line type of memory cell array, any of the first to fourth embodiments above can be applied.

While in the above-mentioned embodiments the capacitor 10 has been described as being of a cylindrical configuration, it can not be limited to the cylindrical one, but may be formed also as an electrical, rectangular, square or polygonal one.

As has been described in the foregoing, according to the present invention, the capacitors are arranged between the adjacent bit lines and positioned higher than the bit lines, and the insulating layer region is formed where no upper electrode of the capacitor exists above the bit line, so that the inter-bit line capacitance and the stray capacitance of the bit lines are reduced. Consequently, a semiconductor memory device with a large amount of the signals read out of the memory cells and thus a large operating margin can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A DRAM structure comprising:
   a first conductivity-type semiconductor substrate having a main surface;
   a plurality of word lines extending in parallel direction on said main surface;
   a plurality of bit lines extending in a direction orthogonally crossing said word lines; and a plurality of memory cells arranged in a direction diagonal to said word lines and said bit lines, each of said memory cells comprising:

a switching device comprising one pair of second conductivity-type impurity regions formed in said semiconductor substrate in a direction diagonally intersecting a word line, and a gate electrode layer formed of a part of the intersecting word line, a first one of said impurity regions being in contact with a portion of a respective bit line at a contact area on the main surface of the substrate; and a capacitor arranged between adjacent bit lines and having a portion positioned at least as high above said main surface as the height of said bit lines;

said capacitor comprising:

a first electrode layer connected to a second one of said impurity regions of said switching device;

a dielectric layer covering the surface of said first electrode layer; and a second electrode layer covering the surface of said dielectric layer and extending higher above the substrate surface than a respective bit line and in non-overlapping relation therewith above said contact area.

2. The DRAM according to claim 1, further comprising an insulating layer formed above the contact portion of each said bit line.

3. The DRAM according to claim 2, wherein said insulating layer extends substantially along the direction of said bit line and the second electrode layer of each said capacitor is formed over a respective one of said memory cells, isolated from the second electrode layer of adjacent capacitors by said insulating layers, and integrally and electrically coupled to the second electrode layer of other capacitors in regions not occupied by said insulating layers.

4. The DRAM according to claim 1, wherein said first and second electrode layers of each capacitor are formed separately from the first and second electrode layers of other capacitors and isolated therefrom by an insulating layer between capacitors, and an electrically conductive layer arranged over said capacitors electrically connecting together the second electrode layers of all capacitors.

5. The DRAM according to claim 1, wherein each said bit line comprises an interconnection extending over the main surface of said semiconductor substrate and a high melting point metal contact portion connected to one of said paired second conductivity-type impurity regions of said switching device.

6. The DRAM according to claim 1, wherein said first electrode layer of each capacitor comprises:

a flat portion comprising a part extending over said word line and said gate electrode layer of said switching device with an insulating film interposed therebetween; and a vertical wall portion formed to protrude upwardly from a surface of said flat portion and surround a space area of a predetermined configuration.

7. The DRAM according to claim 6, wherein the second electrode, covering the top of said vertical wall portion, is higher above the main surface of the substrate than the corresponding bit line in each memory cell.

8. The DRAM according to claim 2, wherein said first electrode layer of said capacitor comprises:

a flat portion comprising a part extending over said word line and said gate electrode layer of said switching device with an insulating film interposed therebetween; and a vertical wall portion formed to protrude upwardly from a surface of said flat portion and surround a space area of a predetermined configuration.

9. The DRAM according to claim 8, wherein in each memory cell the second electrode, covering the top of said vertical wall portion, is higher above the main surface of the substrate than the corresponding bit line.

10. The DRAM according to claim 9, further comprising sense amplifiers connected to respective pairs of said bit lines, each bit line pair comprising adjacent bit lines extending in parallel to each other.

11. The DRAM according to claim 9, further comprising sense amplifiers connected to respective pairs of said bit lines, each bit line pair comprising adjacent bit lines extending in opposite directions from the connection with their respective sense amplifier.

12. The DRAM according to claim 5, where said bit line has a contact portion connected to one of said paired second conductivity-type impurity regions of said switching device, and an insulating layer region is formed above said contact portion of said bit line, between said second electrode layers of adjacent capacitors.

13. The DRAM according to claim 5, wherein an insulating layer extends substantially along the direction of each said bit line and the second electrode layer of each said capacitor is formed over a respective one of said memory cells, isolated from the second electrode layer of adjacent capacitors by said insulating layers, and integrally and electrically coupled to the second electrode layer of other capacitors in regions not occupied by said insulating layers.

14. The DRAM according to claim 5, wherein said first and second electrode layers of each capacitor are formed separately from the first and second electrode layers of other capacitors and isolated therefrom by an insulating layer between capacitors, and an electrically conductive layer arranged over said capacitors electrically connecting together the second electrode layers of all capacitors.

15. A DRAM structure comprising:

a first conductivity-type semiconductor substrate having a main surface;

a plurality of word lines extending in parallel direction on said main surface;

a plurality of bit lines extending in a direction orthogonally crossing said word lines; and a plurality of memory cells, each of said memory cells comprising:

a switching device comprising one pair of second conductivity-type impurity regions formed in said semiconductor substrate and a gate electrode layer formed of a part of an intersecting word line, a first one of said impurity regions being in contact with a portion of a respective bit line at a contact area on the main surface of the substrate; and a capacitor, said capacitor comprising:

a first electrode layer connected to a second one of said impurity regions of said switching device;

a dielectric layer covering the surface of said first electrode layer; and a second electrode layer covering the surface of said dielectric layer and being arranged to extend higher above the substrate surface than said respective bit line and in non-overlapping relation therewith above said contact area.

16. A DRAM structure comprising:

a first conductivity-type semiconductor substrate having a main surface;

a plurality of word lines extending in parallel direction on said main surface;

a plurality of bit lines extending in a direction orthogonally crossing said word lines; and a plurality of memory cells, each of said memory cells comprising:

a switching device comprising one pair of second conductivity-type impurity regions formed in said semiconductor substrate and a gate electrode layer formed of a part of an intersecting word line, a first one of said impurity regions being in contact with a portion of a respective bit line at a contact area on the main surface of the substrate; and a capacitor, said capacitor comprising:

a first electrode layer connected to a second one of said impurity regions of said switching device;

a dielectric layer covering the surface of said first electrode layer; and a second electrode layer covering the surface of said dielectric layer and being arranged to extend higher above the substrate surface than said respective bit line, said second electrode comprising portions which do not overlap said bit lines.

17. The DRAM according to claim 16, wherein said first and second electrode layers of each capacitor are formed separately from the first and second electrode layers of other capacitors and isolated therefrom by an insulating layer between capacitors, and an electrically conductive layer arranged over said capacitors electrically connecting together the second electrode layers of all capacitors.

18. The DRAM according to claim 17, wherein said electrically conductive layer comprises a mesh pattern.

19. The DRAM according to claim 17, wherein said electrically conductive layer comprises a pattern of parallel conductive strips.

20. A DRAM including a semiconductor substrate and successively upwardly configured first, second, third and fourth conductive layers insulated from each other and formed on the substrate, comprising:

a plurality of memory cells arranged in a matrix in directions of rows and columns, each of said memory cells including one switching means and one storage means;

a plurality of word lines formed by said first conductive layer and extending in parallel in the direction of rows, each of said word lines being connected to a control electrode of said switching means of said memory cell arranged in a corresponding row;

a plurality of bit lines formed by said second conductive layer and extending in parallel in the direction of columns, each of said bit lines being connected to a first electrode of said switching means of said memory cell arranged in a corresponding column; wherein said storage means of said each memory cell comprises a lower electrode formed by said third conductive layer and connected to a second electrode of the corresponding switching means; and said fourth conductive layer is formed in a lattice pattern and includes a cross-point portion formed by an upper electrode of said storage means of said memory cell.

21. The DRAM according to claim 20, wherein said storage means of said each memory cell is provided between the adjacent word lines and between the adjacent bit lines.

22. The DRAM according to claim 20, wherein each of said bit lines includes an interconnection portion and a buried portion formed of a different material and connected to said first electrode of said switching means of each respective memory cell.

23. The DRAM according to claim 20, wherein the cross-point portion of said fourth conductive layer does not substantially overlap with said bit lines.

24. A DRAM including a semiconductor substrate and successively upwardly configured first, second, third and fourth conductive layers insulated from each other and formed on the substrate, comprising:

a plurality of memory cells arranged in a matrix in directions of rows and columns, each of said memory cells including one switching means and one storage means;

a plurality of word lines formed by said first conductive layer and extending in parallel in the direction of rows, each of said word lines being connected to a control electrode of said switching means of said memory cell arranged in a corresponding row;

a plurality of bit lines formed by said second conductive layer and extending in parallel in the direction of columns, each of said bit lines being connected to a first electrode of said switching means of said memory cell arranged in a corresponding column, wherein a lower electrode of said storage means of said each memory cell is formed by said third conductive layer in non-overlapping relationship with a respective cell bit line and is connected to a second electrode of the corresponding switching means, and an upper electrode of said storage means of said each memory cell is formed by said fourth conductive layer, juxtaposed to the lower electrode of the corresponding storage means and not overlapping said respective cell bit line, the upper electrodes of all of said storage means being electrically connected.

25. The DRAM according to claim 24, wherein said upper electrodes of said storage means are interconnected by said fourth conductive layer.

* * * * *